(12) United States Patent
Menichelli et al.

(10) Patent No.: US 9,960,203 B2
(45) Date of Patent: May 1, 2018

(54) RADIATION SENSOR

(71) Applicant: Ion Beam Applications, S.A., Louvain-la-Neuve (BE)

(72) Inventors: David Menichelli, Feucht (DE); Michele Togno, Feucht (DE); Friedrich Friedl, Feucht (DE)

(73) Assignee: Ion Beam Applications S.A., Louvain-la-Neuve (BE)

( * ) Notice: Subject to any disclaimer, the term of this patent is extended or adjusted under 35 U.S.C. 154(b) by 0 days. days.

(21) Appl. No.: 15/538,623

(22) PCT Filed: Dec. 18, 2015

(86) PCT No.: PCT/EP2015/080478
§ 371 (c)(1),
(2) Date: Jun. 21, 2017

(87) PCT Pub. No.: WO2016/102360
PCT Pub. Date: Jun. 30, 2016

(65) Prior Publication Data
US 2017/0373115 A1 Dec. 28, 2017

(30) Foreign Application Priority Data
Dec. 21, 2014 (EP) ..................... 14199524

(51) Int. Cl.
*G01T 1/24* (2006.01)
*H01L 27/146* (2006.01)
(Continued)

(52) U.S. Cl.
CPC ........ *H01L 27/14658* (2013.01); *G01T 1/164* (2013.01); *G01T 1/1647* (2013.01); *H04N 5/32* (2013.01)

(58) Field of Classification Search
USPC .................................................. 250/370.09
See application file for complete search history.

(56) References Cited

U.S. PATENT DOCUMENTS

| 2004/0136493 A1 | 7/2004 | Konno et al. |
| 2005/0139757 A1* | 6/2005 | Iwanczyk ............. G01T 1/2928 250/239 |

(Continued)

FOREIGN PATENT DOCUMENTS

WO WO 2011/030240 A2 3/2011

OTHER PUBLICATIONS

International Search Report dated Jan. 29, 2016, 2 pages.

*Primary Examiner* — David Porta
*Assistant Examiner* — Meenakshi Sahu
(74) *Attorney, Agent, or Firm* — Finnegan, Henderson, Farabow, Garrett & Dunner LLP

(57) ABSTRACT

The present disclosure relates to a radiation sensor. In one implementation, the sensor may include a radiation detector array having a plurality of pixels; at least two readout connectors having a plurality of contacts, each readout connector being configured for receiving a readout module; a routing circuit having conductors configured for routing electrical signals from each of the plurality of pixels to a corresponding contact of one of the readout connectors. The plurality of pixels is grouped in two or more groups of pixels, at least two pixels of a first group of pixels being separated by at least one pixel from another group of pixels. The routing circuit is configured for leading pixels of the first group of pixels to a first readout connector, and pixels from the other group of pixels to a second readout connector.

20 Claims, 3 Drawing Sheets

(51) Int. Cl.
*G01T 1/164* (2006.01)
*H04N 5/32* (2006.01)

(56) References Cited

U.S. PATENT DOCUMENTS

| | | |
|---|---|---|
| 2005/0173642 A1 | 8/2005 | Petrick et al. |
| 2005/0286682 A1 | 12/2005 | Tkaczyk et al. |
| 2007/0280409 A1 | 12/2007 | Konno |

\* cited by examiner 100
102 — providing radiation detector array

104 — routing signals from group of pixels to readout connectors

106 — connecting pluggable readout IC(s) to readout connectors

RADIATION SENSOR

This is a National Phase Application which claims benefit to PCT Application No. PCT/EP2015/080478, filed Dec. 18, 2015, published as WO 2016/102360, and which claims benefit of European Application No. 14199524.1, filed Dec. 21, 2014, all of which are incorporated herein by reference.

FIELD OF THE INVENTION

The invention relates to the field of radiation sensors. More specifically, it relates to a radiation sensor having an electric circuit for routing electrical signals from a radiation detector array to a plurality of electronic readout circuits.

BACKGROUND OF THE INVENTION

Detectors comprising a one-dimensional or two-dimensional array of detector pixels are commonly used for radiation imaging, for example, in medical applications such as nuclear medicine, radiology, radiotherapy or proton-therapy. In a radiation detector array, each pixel may be adapted for generating a signal, such as an electric current, an electric charge or an electric potential, that is indicative for a dosimetric or radiative quantity related to radiation incident on that pixel. For example, silicon diodes and ionization chambers may be commonly used in pixel elements for radiation detection applications.

Pixel signals may be read out in parallel using a front-end electronic subsystem comprising a plurality of multi-channel integrated circuits. For instance, in an imaging array known in the field, the IBA MatriXX detector array, the current from 1024 ionization chambers may be integrated in parallel by 16 dedicated chips, each having 64 input channels. Thus, such imaging system may also require an efficient means for routing and switching of the signals from the pixels to the readout channels of the front-end electronic subsystem. This signal routing may affect the dynamic range and the image quality of the images produced by the device, and may furthermore influence the achievable detector area and pixel pitch due to limitations in available area for routing.

At least one interposer printed circuit board (PCB) may connect the sensor pixels to the readout chips. For example, all signal lines may be provided on a PCB which may also form an integral part of the sensor array, while the readout chips may be connected to these signal lines, e.g. using a connector mechanism to allow easy replacement and/or maintenance. For example, each readout chip may be soldered onto a small carrier PCB that can be plugged into the interposer PCB using connectors.

United States patent application US 2005/286682 discloses a detector for use in a radiation imaging system. This detector module comprises a sensor array for converting X-ray signals to electrical signals, at least one electronic device for converting the electrical signals to a corresponding digital signal, and a switching circuit for routing the electrical signals from the sensor array to the electronic device.

X-ray detectors for imaging applications are known, e.g., from US 2004/0136493 and US 2005/0173642. These detectors comprise a 2D-array of pixels. These pixels are organised as n lines by m columns and require a switched element, such as an FET, at each pixel. The individual pixels are accessed by sequentially addressing the n scan lines and acquiring the pixels values from the m pixels of each line through the m data lines. Such designs have the advantage that only m channels of readout circuits are necessary. The switching elements may introduce measurement errors, which may be not acceptable, especially when weak signal values are expected. In addition, when the detector is to be used in high dose applications, such as radiotherapy machine QA, or on-line or off-line treatment plan verification, the switching element may not be resistant to the high radiation dose.

A pixelated photon counting mode detector is known from US 2005/139757. In this detector, the readout circuits, implemented in an ASIC chip, are connected to a detector array through a ball grid array package having a plurality of solder balls formed on a first side and a plurality of electrical contacts formed on a second side. The readout circuits are within each pixel's geometric area. The readout circuits are located in immediate vicinity to the corresponding detectors, and submitted to the same radiation field.

The routing of the pixel signals to the front-end electronics can be a complicated task. The routing between the array pixels and the input channels of the readout chips may be optimized to simplify the layout and/or to obtain a good performance. For example, parameters that may be tuned by such optimization of the design are the length of the signal lines, the line impedance, the number of via connections, the cross talk between channels, the sensitivity to electromagnetic disturbances and the radiation of electromagnetic disturbances.

However, the overall cost of readout electronics may represent a large fraction of the overall detector price, particularly for detectors with many pixels. State-of-the-art readout chips may be quite expensive, and may be required to be mounted on advanced PCBs as well. For example, in a Stereotactic Body Radiation Therapy (SBRT) imaging array comprising a large number of silicon diode pixels, e.g. about 2000 pixels or more, the cost of readout electronics could amount to about 40% of the production cost.

It is particularly advantageous to achieve a high spatial resolution and a small pixel pitch in a detector array. For example, two-dimensional detectors having a small pixel pitch can be used for accurately measuring radiation fields characterized by high radiation dose gradients, e.g. for stereotactic radiotherapy applications. However, for two-dimensional detector arrays covering a predetermined area, the number of pixels is proportional to $(1/\text{pitch})^2$. The cost and design complexity may therefore also increase in proportion to $(1/\text{pitch})^2$. This implies that an optimal trade-off may be sought between spatial resolution and device complexity, e.g. as determined by the cost versus the benefit to the user.

As an example, if a 12×12 $cm^2$ active area is covered with 3 mm pixel pitch, 1600 channels may be needed. However, this number rises to 2304 when the pitch is only slightly reduced to 2.5 mm. The cost of a pixel array may depend mainly on the area, e.g. for technologies such as ionization chamber arrays implemented on a PCB or monolithic silicon, while the cost of the corresponding readout electronics rises with the number of pixels.

SUMMARY OF THE INVENTION

It is an object of embodiments of the present invention to provide good and efficient means and methods for routing signals from a detector array to a plurality of readout devices.

It is an advantage of embodiments of the present invention that simple and inexpensive means and methods are provided for tuning the spatial resolution of a pixelated detector to the requirements of a specific application, without risking underperformance, e.g. in the sense of too few channels being provided, or a disproportionate cost, e.g. in the sense of too many channels being provided.

The above objective is accomplished by a method and device according to the present invention.

In a first aspect, the present invention relates to a radiation sensor comprising a radiation detector array having a plurality of pixels; at least two readout connectors having a plurality of contacts, each readout connector being configured for receiving a readout module; a routing circuit having conductors configured for routing electrical signals from each of said plurality of pixels to a corresponding contact of a readout connector, wherein said plurality of pixels is grouped in two or more groups of pixels, at least two pixels of a first group of pixels being separated by at least one pixel from another group of pixels in the radiation detector array, said routing circuit being configured for leading signals from pixels of said first group of pixels to a first readout connector, and signals from pixels from said other group of pixels to a second readout connector.

Preferably the pixels of said two groups are uniformly distributed and intermixed in said radiation detector array.

The invention also relates to a radiation image sensor comprising a radiation detector array. The radiation detector array comprises at least two groups of pixels, e.g. at least two disjunct sets of pixels. The radiation image sensor further comprises at least two readout connectors corresponding to this at least two groups of pixels, e.g. the radiation image sensor may comprise a single, distinct readout connector for each group of pixels. The radiation image sensor also comprises an electronic routing circuit configured for routing electrical signals from each of the at least two groups of pixels to the corresponding readout connector of the at least two readout connectors. Each of the at least two readout connectors is configured for receiving a readout module such that each group or subset of groups of the at least two groups of pixels is selectable by connecting at least one readout module to a corresponding at least one readout connector of the at least two readout connectors.

Preferably, the readout module is a pluggable readout module that can be plugged into one of the at least two readout connectors. To this end, each readout connector of the at least two readout connectors is adapted for enabling the mechanical disconnection of a corresponding readout module such as to enable removal and/or replacement thereof.

A radiation image sensor according to some embodiments of the present invention may further comprise the at least one readout module, for example one readout module. In a radiation image sensor according to some embodiments of the present invention, the pixels of at least some different groups of the at least two groups of pixels may be spatially intermixed.

Pixels of two different groups A and B are spatially intermixed when along a given line there are one or more pixels of group B that are located in between pixels of group A or vice versa. A line is, for example, a row or a column of a two-dimensional array (or part of row or part of a column) or it can be a diagonal line or any other line on the detector.

For example, for a one dimensional array having two groups A and B, a few examples of spatially intermixing pixels of group A and B can be done as follows: ABABA-BABABAB . . . or BABABABABABA . . . or AABBAAB-BAABB . . . or AAABBBAAABBB . . . .

In another example, when there are three groups of pixels A, B and C, there are multiple possibilities of spatially intermixing pixels of A and B in a three group array configuration. A few examples of intermixing pixels of group A and B of such an array having three groups are: ABCABCABC . . . or CCCABABABCCCABABAB-CCC . . . or AABBCCAABBCC . . . .

In another example of a two-dimensional array where there are three groups of pixels A, B, and C, pixels of group A and B can for example be spatially intermixed on a row and/or column and there might be, for example, an additional diagonal line or any other line on the detector comprising only pixels of group C.

The advantage of spatially intermixing pixels of at least two different groups A, B is that by plugging in one readout module for group A, the detector has a first resolution and by plugging in an additional readout module for group B, the detector acquires a second, improved resolution. In a radiation image sensor according to some embodiments of the present invention, the pixels of at least some different groups of the at least two groups of pixels may be spatially intermixed in at least a first and a second direction, e.g. in both a first direction and in a second direction substantially orthogonal to the first direction.

For example in a two-dimensional array, spatially intermixing pixels of group A and B in at least a first and a second direction can correspond to spatially intermixing along a row and a column. For example:

AABBAABBAA
B
A
A
B
B

In a radiation image sensor according to some embodiments of the present invention, the radiation detector array may comprise a track of pixels being spatially intermixed by alternating along said track pixels of two different groups of said at least two groups. The track may be defined as a number of adjacent pixels along a line.

On a detector array according to a preferred embodiment, a track can be identified where pixels are spatially intermixed by alternating along the track pixels of two different groups.

In a two dimensional array, a track can, for example, be a row or a column or a diagonal (or part of a row or part of column or part of a diagonal). Alternating along a track has to be construed such that each pixel of a first group A is being preceded and/or followed by a pixel of a second group B.

In another embodiment, the radiation detector array comprises at least two tracks of pixels that are spatially intermixed by alternating along each of the at least two tracks pixels of two different groups.

For example, in a two-dimensional array, one track can be a row and another track can be a column.

In the following example there are two tracks (a row and a column) where pixels of group A and B are intermixed by alternating, along two tracks, a pixel of group A with a pixel of group B:

ABABABABA
A
B
A
B

In a radiation image sensor according to some embodiments of the present invention, the at least two groups of pixels may comprise a first group of pixels which may be distributed over the radiation detector array such as to obtain a substantially uniform distribution of pixels of the first group of pixels over the radiation detector array. In a radiation image sensor according to embodiments of the present invention, the at least two groups of pixels may comprise a second group of pixels, and this second group of pixels may be distributed over the radiation detector array such as to obtain a substantially uniform distribution of pixels of the second group of pixels over the radiation detector array.

In a radiation image sensor according to some embodiments of the present invention, the at least two groups of pixels may comprise a further group of pixels, and the further group of pixels may be distributed over the radiation detector array such as to obtain a concentrated distribution of pixels of the further group of pixels over the radiation detector array.

In a radiation image sensor according to some embodiments of the present invention, the routing circuit may comprise a printed circuit board.

In a radiation image sensor according to some embodiments of the present invention, each readout connector of the at least two readout connectors may be adapted for enabling the mechanical disconnection of a corresponding pluggable readout module such as to enable removal and/or replacement thereof. In a radiation image sensor according to some embodiments of the present invention, each readout connector of the at least two readout connectors may comprise at least one socket for receiving a pluggable readout module.

In a radiation image sensor according to some embodiments of the present invention, the radiation detector array may be a linear array of pixels, e.g. a linear one-dimensional array, a two-dimensional array of pixels or a three-dimensional array of pixels.

In a second aspect, the present invention relates to a method for configuring a radiation image sensor, the method comprising providing a radiation detector array having a plurality of pixels; providing at least two readout connectors having a plurality of contacts, each readout connector being configured for receiving a readout module; providing a routing circuit having conductors configured for routing electrical signals from each of said plurality of pixels to a corresponding contact of a readout connector; grouping said plurality of pixels in two or more groups of pixels, at least two pixels of a first group of pixels being separated by at least one pixel from another group of pixels in the radiation detector array; configuring said routing circuit for leading pixels of said first group of pixels to a first readout connector, and pixels from said other group of pixels to a second readout connector.

Preferably, said grouping is such that the pixels of said two groups are uniformly distributed and intermixed in said radiation detector array.

The invention also relates to method for configuring a radiation image sensor, e.g. a radiation image sensor according to embodiments of the first aspect of the present invention. The method comprises providing a radiation detector array having at least two groups of pixels and at least two readout connectors corresponding to the at least two groups of pixels. The method further comprises routing electrical signals electrical signals from each of the at least two groups of pixels electrical to a corresponding readout connector of the at least two readout connectors. The method also comprises connecting at least one pluggable readout module to a corresponding at least one readout connected of the at least two readout connectors such that a group or subset of groups of the at least two groups of pixels is selected.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
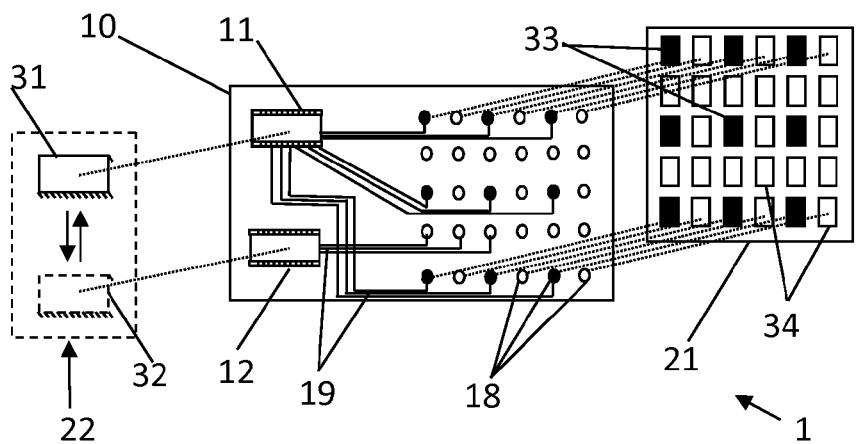
FIG. 1 shows an electric circuit board according to embodiments of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may be. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In a first aspect, the present invention relates to a radiation image sensor comprising a radiation detector array that has at least two groups of pixels, e.g. at least two disjunct sets of pixels. The radiation image sensor further comprises at least two readout connectors corresponding to these at least two groups of pixels, e.g. the radiation image sensor may comprise a single, distinct readout connector for each group of pixels. The radiation image sensor also comprises a routing circuit configured for routing electrical signals from each of the at least two groups of pixels to the corresponding readout connector of the at least two readout connectors. Each of the at least two readout connectors is configured for receiving a readout module such that each group or subset of groups of the at least two groups of pixels is selectable by connecting at least one readout module to a corresponding at least one readout connector of the at least two readout connectors. Preferably, the readout module is a reversibly connectable/disconnectable module that can be reversibly connected/disconnected into one of the at least two readout connectors. The readout module advantageously may be a pluggable readout module that can be plugged into one of the at least two readout connectors. To this end, each readout connector of the at least two readout connectors is adapted for enabling the mechanical disconnection of a corresponding readout module such as to enable removal and/or replacement thereof.

FIG. 1 illustrates a radiation image sensor 1 according to embodiments of the present invention. This radiation image sensor comprises a radiation detector array 21 that has at least two groups of pixels. The plurality of pixels arranged in the radiation detector array 21 may, for example, comprise a plurality of ionization chamber detectors, scintillation detectors, Cerenkov counters and/or solid state detectors such as semiconductor detectors, e.g. silicon, germanium or diamond counters. While the present invention may relate to a radiation image sensor 1 comprising a plurality of pixels on a radiation imaging sensor board 21 for detecting non-ionizing radiation, e.g. photons in the infrared, visual and/or ultraviolet spectrum, a radiation image sensor 1 according to embodiments of the present invention that comprises a plurality of pixels on a radiation imaging sensor board 21 for detecting ionizing radiation may be particularly advantageous.

While principles of the present invention may be applied to non-ionizing radiation such as visual light image detection, such detectors as known in the art may be amenable to extreme miniaturization and integration by advantageous use of refraction, diffraction and/or reflection. Detector miniaturization and integration is limited to a larger scale for ionizing radiation imaging, e.g. field imaging of ionizing radiation may require large area detectors. Furthermore, ionizing radiation may be damaging to the pixel detectors and the supporting electronics, e.g. to electronic readout circuit modules 22. Detection of ionizing radiation is also relevant for applications in medicine, where stringent requirements may be imposed on accuracy, reproducibility and calibration of the acquired images, such that easy maintenance and replacement of components of the imaging system is particularly advantageous. It is an advantage of embodiments of the present invention that modular components for an imaging system are provided such as to allow easy maintenance, replacement and/or upgrades of the system.

The radiation image sensor 21 may be a linear array of pixels, a one-dimensional array of pixels, a two-dimensional array of pixels or a three-dimensional array of pixels. The radiation detector array 21 may be adapted for generating a plurality of electrical signals corresponding to a spatial distribution of radiation incident on the sensor array. For example, this radiation detector array 21 may comprise a plurality of ionization chambers, solid state detectors for ionizing radiation or other radiation detectors organized in a linear array, e.g. a one-dimensional array, a grid, e.g. a two-dimensional array, or a volume matrix, e.g. a three-dimensional array.

The radiation image sensor may be adapted for use in an imaging system. For example, such imaging system may comprise an X-ray source disposed in a spatial relationship to an object configured to transmit X-ray radiation through the object. The imaging system may comprise the radiation image sensor configured to convert the X-ray radiation to corresponding electrical signals, e.g. to digital output signals provided by pluggable readout modules 22 when connected to corresponding connectors. The imaging system may also comprise a processing means, e.g. a processor, for processing the electrical signals, e.g. the digital output signals, to form an image representation of the object.

The radiation detector array 21 comprises at least two groups of pixels 33, 34. The pixels of at least some different groups of the at least two groups of pixels may be spatially intermixed. For example, a convex hull having minimal area while enclosing all pixels in a first group may also enclose at least one pixel of a second group of pixels, e.g. may enclose a substantial portion of the pixels of a second group of pixels, e.g. at least 10%, or at least 25%, for example, at least 50%, or even at least 75%, at least 90% or at least 95%. The pixels of at least some different groups of the at least two groups of pixels may be spatially intermixed in at least a first and a second direction, e.g. in a first direction, and in a second direction substantially orthogonal to the first direction, e.g. orthogonal to the first direction. The pixels of at least some different groups of the at least two groups of pixels may be spatially intermixed at pixel level. For example, each pixel of a first group may have at least one neighbouring pixel of another group. Furthermore, each pixel of a first group may have only neighbouring pixels of another group or other groups.

The number of pixels in a first group 33 of these at least two groups of pixels may be less than or equal to about half of the total number of pixels of the radiation detector array, although embodiments are not limited thereto. For example, the number of pixels in this first group may be less than or equal to 55% of the number of pixels of the radiation detector array. This first group of pixels 33 may furthermore be distributed over the radiation detector array such as to obtain a substantially uniform distribution of pixels of the first plurality of pixels 33 over the radiation detector array 21, e.g. over the active area of the radiation detector array, e.g. over the total area of the detector array that is covered by pixels. Furthermore, in some embodiments of the present invention, the at least two groups of pixels may also comprise a second group of pixels 34 in which this second group of pixels 34 is also distributed over the radiation detector array such as to obtain a substantially uniform distribution of pixels of the second group of pixels 34 over the radiation detector array 21. Embodiments of the present invention may also relate to a device 1 in which the at least two groups of pixels comprises N groups of pixels, where N>2, for example 3 groups, 4 groups, 5 groups, 6 groups, 7 groups, 8 groups, 9 groups, 10 groups, or even more groups, in which each group of pixels is distributed over the radiation detector array such as to obtain a substantially uniform distribution of that group of pixels over the radiation detector array 21. In a radiation image sensor according to some embodiments of the present invention, the at least two groups of pixels may comprise a further group of pixels 35 that is distributed over the radiation detector array such as to obtain a concentrated distribution of pixels of the further group of pixels 35 over the radiation detector array 21. For example, the geometrical center of the further group of pixels 35 may differ significantly from the geometrical center of the set of all pixels of the detector array 21. Thus, a specific region of interest may be covered the further group of pixels. In an exemplary embodiment of the invention, an array of detectors may be divided in a first group in the central region of the array, and a second group, peripheral to the first region. Thereby, a given detector array may be configured for detecting small fields, by installing a readout module in the readout connector(s) corresponding to the first group, and for detecting large fields by installing also a readout module in the readout connector(s) corresponding to the second group. The term 'further group' does not imply that the 'first group' and/or the 'second group' referred to hereinabove are necessarily present in the same embodiment of the present invention, but merely serves to distinguish possible configurations of groups of pixels as discussed herein.

The radiation image sensor 1 further comprises at least two readout connectors corresponding to the at least two groups of pixels. For example, a first readout connector may be adapted for operably connecting to a first readout integrated circuit and a second readout connector may be adapted for operably connecting to a second readout integrated circuit. A radiation image sensor 1 according to embodiments of the present invention may also comprise the at least one pluggable readout module 31, 32, for example, the sensor 1 may comprise one pluggable readout module 31. Each readout connector of the at least two readout connectors 11, 12 may be adapted for enabling the mechanical disconnection of a corresponding pluggable readout module 31, 32, such as to enable removal and/or replacement thereof. Each readout connector of the at least two readout connectors 11, 12 may comprise at least one socket for receiving a pluggable readout module. The at least two readout connectors 11, 12 may be adapted for reading out electrical signals generated by pixels of the array 21 in response to radiation incident on these pixels. The pluggable readout module may be an electronic readout device for converting the electrical signals to a corresponding digital signal. For example, each electronic readout circuit be adapted for receiving a plurality of electrical signals, e.g. each electrical signal being provided by a corresponding pixel of the plurality of pixels, for example, via a corresponding plurality of mutually independent input channels of the electronic readout circuit. Each electronic readout circuit may be adapted for amplifying, filtering and/or digitizing each of the received electrical signals. Each electronic readout circuit may be a front-end readout chip for the imaging sensor. The pluggable readout modules, e.g. electronic readout circuits, may be substantially identical, e.g. may be essentially interchangeable.

The radiation image sensor 1 also comprises an electronic routing circuit 10 adapted for, e.g. configured for, routing electrical signals from each of the at least two groups of pixels to a corresponding readout connector of the at least two readout connectors. For example, the electronic routing circuit 10 may comprise electrical routing means on an electric circuit board, e.g. an electronic circuit board, such as a printed circuit board (PCB) or a known alternative for mechanically supporting and electrically interconnecting electronic components, for example, a flexible circuit board. The electronic routing circuit may thus comprise conductive paths provided on and/or in a substrate, such as strips, bands, layers and/or wire elements composed of a conductive metal provided on a substrate comprising an electrically insulating material, such as silicon dioxide or a non-conductive polymer. These conductive paths may for example comprise a carbon-based conductive material, e.g. a conductive carbon ink printed on the substrate. It is an advantage of such carbon-based material that a good radio transparency can be achieved, e.g. that the conductive paths do not significantly attenuate a radiation field of interest, such as a gamma radiation distribution to be measured. In some embodiments, the electronic routing circuit 10 in the form of an electric circuit board may comprise connecting means 18 for electrically connecting the electric circuit board to the plurality of pixels, such as bond pads. Thus, the electric circuit board may be adapted to operably connect to the plurality of pixels by contacting the electric circuit board to the radiation imaging sensor board 21 such as to electrically connect the connecting means 18 of the electric circuit board to complementary connecting means on the radiation imaging sensor board 21. However, in other embodiments, the radiation detector array 21 and the electronic routing circuit 10 may be integrated on a single electric circuit board. For example, the plurality of pixels may be integrated on or in the electric circuit board comprising the routing circuit. Thus, the electric circuit board may be a radiation imaging sensor board comprising a plurality of pixels and the electronic routing circuit. For example, the plurality of pixels may be provided on a first major surface of an electric circuit board, while electric routing means for routing signals to and from the pixels may be provided on a second major surface of the electric circuit board, and connected thereto by vias through the substrate.

The electronic routing circuit 10 may be adapted for routing electrical signals from a plurality of pixels arranged in the radiation detector array 21 to a plurality of readout connectors, in which each readout connector can be provided with a pluggable readout module 22. The routing means may be adapted for electrically connecting a first group of pixels to a first readout connector and for electrically connecting a second group of pixels to a second readout connector. These electrical signals may comprise an electrical signal for each pixel that is representative of a property of the radiation incident on that pixel, e.g. the signal may convey information relating to a peak energy, mean energy, energy bandwidth, intensity and/or quality of radiation received during a detector integration time on the pixel to which the signal relates. The electronic routing circuit 10 may be an interposer circuit for providing an electrical interface to the radiation detector array 21.

The electronic routing circuit 10 may be adapted for routing electrical signals from the plurality of pixels to a plurality of electronic readout circuits 22. These electronic readout circuits 22 may be adapted for reading out said array 21 of radiation detector pixels. For example, each electronic readout circuit of the plurality of electronic readout circuits may be adapted for receiving a plurality of electrical signals, e.g. each electrical signal being provided by a corresponding pixel of the plurality of pixels, for example via a corresponding plurality of mutually independent input channels of the electronic readout circuit. Each electronic readout circuit 22 may be adapted for amplifying, filtering and/or digitizing each of the received electrical signals. For example, each electronic readout circuit may be a front-end readout chip for the imaging sensor. The electronic readout circuits 22 may be adapted for controlling the readout of the pixels connected thereto in a parallel manner, a temporally serial manner or a combination thereof. The electronic readout circuits 22 may also be adapted for controlling the signal acquisition of the pixels connected thereto. For example, the electronic readout circuits 22 may comprise a controller for controlling a plurality of row selection switches, a plurality of pixel reset switches, pixel voltage potential sources and/or pixel signal transfer gate switches.

In embodiments according to the present invention, each readout connector is configured for receiving a pluggable readout module, such that each group or subset of groups of pixels is selectable by connecting at least one pluggable readout module to a corresponding at least one readout connector of the plurality of readout connectors. Particularly, each readout connector may be configured to receive a pluggable readout module, in which each pluggable readout module 22 may be substantially identical, e.g. may be essentially interchangeable with each other pluggable readout module. It is an advantage of embodiments of the present invention that the device 1 according to embodiments can be adapted for working in combination with a plurality of interchangeable electronic readout circuits, e.g. such as to allow easy replacement of a defective readout circuit providing essential information on a coarse spatial level, as explained further herein below, by a readout circuit previously assigned to gathering more detailed spatial information.

The electronic routing circuit 10 may comprise a first readout connector 11 for operably connecting to a pluggable readout module 31. For example, the plurality of pluggable readout modules 22 may comprise at least one first integrated circuit 31 for providing a coarse resolution readout of the array 21. The electric circuit board 10 may also comprise a second readout connector 12 for operably connecting to a second pluggable readout module 32. For example, the plurality of electronic readout circuits 22 may comprise at least one second pluggable readout module 32 for providing a detailed readout of the array 21 when combined with the coarse resolution readout.

For example, the first and/or the second readout connector 11, 12, or any further readout connector discussed further herein below, may comprise at least one socket for receiving at least one corresponding readout integrated circuit. For example, a readout connector may comprise one or more sockets for receiving one or more readout integrated circuits, e.g. readout chips. Each readout chip may be mounted on a PCB to form a chip module, which can be plugged into the readout connector. Other means for implementing the readout connector such as to be adapted for operably connecting to at least one readout integrated circuit are well within the capabilities of the skilled person, e.g. may involve solder bumps, bond pads and/or wire plugs.

However, in particularly advantageous embodiments, the first and/or the second readout connector 11, 12, or any further readout connector 13, 14 discussed further herein below, may be adapted for enabling the mechanical disconnection of the corresponding at least one readout integrated circuit such as to enable removal and replacement thereof. For example, in a modular design, readout integrated circuits can be added to or removed from the system by simply plugging or unplugging chip modules in the readout connectors. This has the additional advantage of allowing an easy replacement of defective parts.

The first readout connector 11 may be adapted for operably connecting to at least one readout integrated circuit 31 for providing a low-resolution readout of the image sensor, in which low-resolution refers to a substantially lower spatial resolution than the maximum spatial resolution obtainable by the image sensor, e.g. as determined by the pixel pitch of the plurality of pixels. A substantially lower spatial resolution than the maximum spatial resolution may, for example, be half the maximum spatial resolution in at least one direction of the pixel array, or even lower, for example, ⅓ of the maximum spatial resolution in at least one direction of the pixel array, or ½ of the maximum spatial resolution in at least one direction of the pixel array. Furthermore, a substantially lower spatial resolution than the maximum spatial resolution may, for example, be half the maximum spatial resolution or lower for all principal directions of the pixel array.

The electric circuit board 10 also comprises electrical routing means 19 for electrically connecting a first plurality of pixels 33 of the radiation detector array to the first readout connector 11 and for electrically connecting a second plurality of pixels of the radiation detector array to the second connector 12. For example, the electrical routing means may comprise conductive paths provided in and/or on a substrate of the electric circuit board for routing signals between each pixel, e.g. from bond pads for connecting to each pixel of the array, and its corresponding readout connector. The first plurality of pixels and the second plurality of pixels may form a partition of the entire set of pixels of the radiation detector array. However, as further discussed herein below, the electrical routing means 19 may also be adapted for electrically connecting at least one further plurality of pixels 34,35 of the radiation detector array to a corresponding at least one further readout connector 13,14. In such a case, the first plurality of pixels, the second plurality of pixels and all further pluralities of pixels may form a partition of the entire set of pixels of the radiation detector array. Thus, the electrical routing means may be adapted for connecting each pixel of the radiation detector array to exactly one readout connector of the first readout connector, the second readout connector or the at least one further readout connector.

The number of pixels in the first plurality of pixels 33 is less than or equal to about half the number of pixels of the radiation detector array, and the first plurality of pixels is distributed over the radiation detector array such as to obtain a substantially uniform distribution of pixels of the first plurality of pixels, e.g. a uniform distribution insofar as can be accommodated by the discrete nature of the pixels, over the area of the radiation detector array. For example, the first plurality of pixels 33 may be distributed in between, e.g. among, the other pixels of the array such as to obtain a substantially uniform density of pixels of the first plurality of pixels over the active area of the radiation detector array. Thus, an image can be obtained over substantially the entire area of the radiation detector array using only the first plurality of pixels 33, e.g. by only reading out the detector array using the first at least one readout integrated circuit 31. Therefore, the array may be operated at a low resolution by only connecting the first at least one readout integrated circuit to the first readout connector, thus avoiding the cost of connecting the second at least one readout integrated circuit when a higher spatial resolution is not required. Furthermore, when a failure occurs in a readout integrated circuit, the other readout integrated circuits can still provide a useful image over the entire detector area, however at the cost of a reduced spatial resolution. It is clear that the first at least one integrated circuit can provide such reduced spatial resolution, should the second at least one integrated circuit fail. However, since the first plurality of pixels 33 is distributed in between the other pixels of the array, such as to obtain a substantially uniform density of pixels of the first plurality of pixels over the area of said radiation detector array, the pixels not assigned to the first plurality of pixels are also substantially uniformly distributed in between the first plurality of pixels over the area of the radiation detector array. Thus, also a failure of the first at least one integrated readout circuit can be compensated, at the cost of a reduced spatial resolution, when all readout connectors are connected to a corresponding at least one integrated readout circuit, e.g. when all connector sockets are provided with readout chips.

Figure 2:
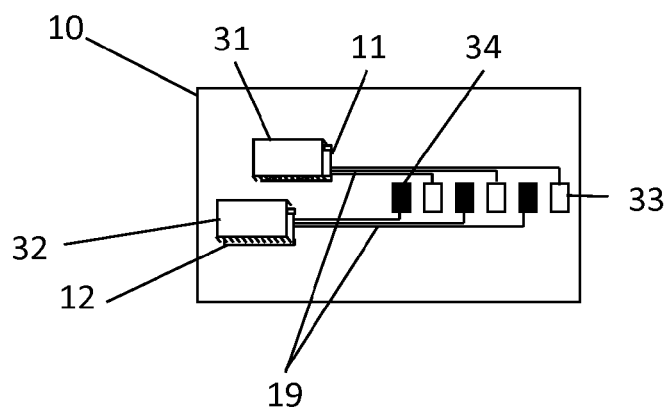
FIG. 2 shows an exemplary electric circuit board according to embodiments of the present invention.

An exemplary electronic routing circuit 10 for routing electrical signals from a plurality of pixels arranged in a radiation detector array 21 to a plurality of electronic readout connectors 11, 12 according to embodiments of the present invention is shown in FIG. 2.

In this exemplary embodiment, the radiation detector array is a linear array, e.g. the plurality of pixels are arranged along a one-dimensional line. However, embodiments of the present invention are not limited to one-dimensional arrays, as illustrated by, for example, the two-dimensional arrays depicted in FIGS. 1, 3 and 4. Other embodiments of the present invention may relate to two-dimensional arrays, e.g. in which the pixels are laid out in columns and rows, or even three-dimensional arrays, e.g. in which the pixels are laid out in columns, rows and stacked layers. Since the number of pixels generally increases rapidly with the dimensionality of the array, as already discussed in the background section hereinabove, embodiments of the present invention relating to two or even three dimensional arrays may be particularly advantageous, e.g. in managing the cost of readout electronics as determined by application-specific requirements.

In this example, the number of pixels in the first plurality of pixels 33 is less than or equal to half the number of pixels of the radiation detector array, e.g. the number of pixels may be equal, and the first plurality of pixels is distributed over the radiation detector array such as to obtain a substantially uniform distribution of pixels of the first plurality of pixels. For example, as shown, pixels of the first plurality of pixels 33 and pixels of the second plurality of pixels 34 may alternate. Therefore, the array may be operated at a low resolution by only connecting the first at least one readout integrated circuit to the first readout connector. Note that in embodiments according to the present invention, the number of pixels in the second plurality of pixels 34 may also be equal to half the number of pixels of the radiation detector array, and the second plurality of pixels may also be distributed over the radiation detector array such as to obtain a substantially uniform distribution of pixels of the second plurality of pixels. Therefore, the device may acquire low-resolution images, e.g. images at half the maximum achievable spatial resolution of the detector array, using only either the first at least one readout integrated circuit 31 or the second at least one readout integrated circuit 32, while acquiring full-resolution images using both. Therefore, the device can offer customizability, e.g. an upgrade of resolution can be easily achieved by installing either at least one readout integrated circuit where it was previously not installed, and can offer redundancy, e.g. failure of either at least one readout integrated circuit results in a failsafe mode providing a reduced resolution.

Figure 3:
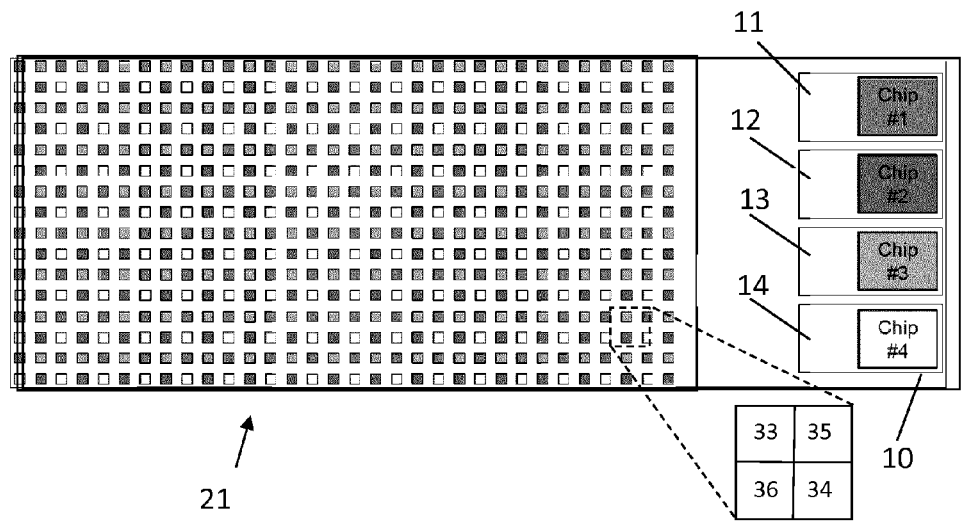
FIG. 3 shows a first exemplary routing arrangement for an electric circuit board according to embodiments of the present invention.
Figure 4:
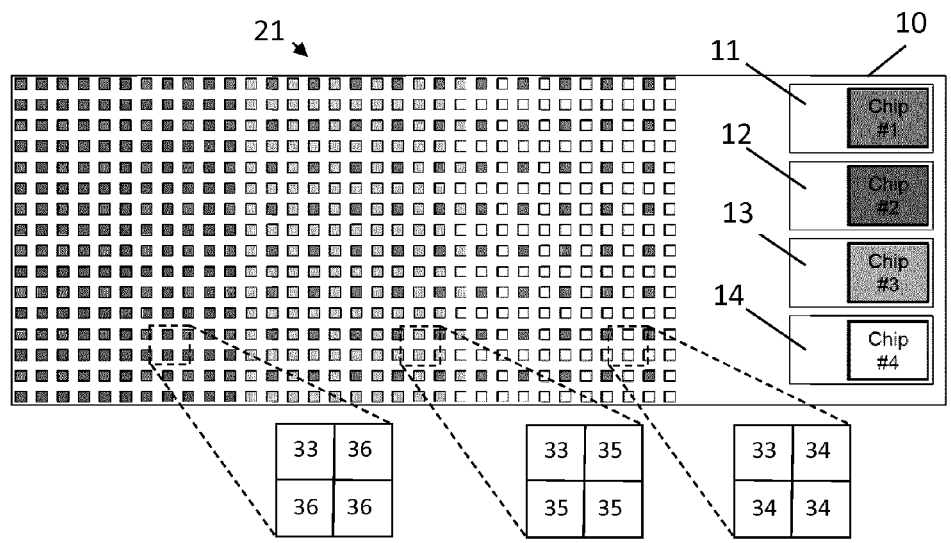
FIG. 4 shows a second exemplary routing arrangement for an electric circuit board according to embodiments of the present invention.

An electronic routing circuit 10 according to embodiments of the present invention may comprise at least one further readout connector 13, 14 for operably connecting to an at least one further at least one readout integrated circuit of the plurality of electronic readout circuits 22. Furthermore, the electrical routing means 19 may be adapted for electrically connecting at least one further plurality of pixels 35,36 of the radiation detector array 21 to the corresponding at least one further at least one readout integrated circuit. For example, FIG. 3 and FIG. 4 show two exemplary schemes for routing the plurality of pixels of a two-dimensional array to respectively four readout connectors 11, 12, 13, 14, e.g. in these examples, the at least one further plurality of pixels may be referred to as respectively a third plurality of pixels and a fourth plurality of pixels. It will be understood by the person skilled in the art that this number is merely exemplary and embodiments of the present invention may comprise any number of further pluralities of pixels.

As can be seen in the examples of FIG. 3 and FIG. 4, the routing circuit of a radiation sensor of the invention may be designed in such a way that the readout connectors 11, 12, 13, 14 are located at a distance from the region where the radiation detector array is located. Thereby, the readout modules will be outside of a radiation filed when the radiation sensor is in use. This will prevent the electronic circuits of the readout modules from being damaged by the radiation. The distance between the radiation detector 21 array and the readout connectors 11, 12, 13, 14 may be adapted according to the needs of the application.

A first possible scheme for routing the pixel signals of a detector array by an electric circuit according to embodiments of the present invention is shown in FIG. 3. For example, the radiation detector array may be a module for a larger two-dimensional array. The module may for example comprise 512 pixels, e.g. the sensor module may carry a matrix of 16×32 pixels. The pixels may be read out by 4 chips, referred to as Chip #1 to Chip #4, each having 128 input channels. Each chip may be mounted on a chip module, which can be plugged on a connector on the sensor module.

The electrical signals of pixels of the module may be routed by an electric circuit board 10 according to embodiments of the present invention, in which the first plurality of pixels 33 comprises all pixels of the radiation detector array having both an odd row index and an odd column index, e.g. when the rows of this exemplary module are numbered 1 to 16 from top to bottom and the columns are numbered 1 to 32 from left to right. Thus in embodiments of the present invention, the first plurality of pixels may be arranged such that the first plurality of pixels does not contain an adjacent pair of pixels.

In embodiments according to the present invention, each pixel of the first plurality of pixels may have a distance to its closest neighbouring pixel of the first plurality of pixels that is a predetermined integer k>1 times a pixel pitch of the radiation detector array 21. For example, k may be equal to 2, 3, 4, 5, or even higher, e.g. 8, 10, 15 or 20.

Likewise, the second plurality of pixels 34 may comprise all pixels of the radiation detector array having both an even row index and an even column index, while the third plurality of pixels 35 and the fourth plurality of pixels 36 may comprise all pixels of the radiation detector array having respectively simultaneously an even row index and an odd column index, and simultaneously an odd row index and an even column index. Thus, in embodiments of the present invention, the first, second and/or any or each of the at least one further plurality of pixels may be arranged such that no adjacent pixel pairs are included in this first, second and/or any or each of the at least one further plurality of pixels.

In this example, a smart signal routing is provided, in the sense that the spatial resolution of the array can be improved by adding readout chips to the system, and several combinations are possible. For example, if only the first at least one readout integrated circuit 31 is used, e.g. Chip #1, the spatial resolution can be 2-L in horizontal and vertical directions, and 2.8-L along diagonals, wherein L refers to the pixel pitch of the detector array 21. This may be considered as a low cost solution.

However, if both the first and the second at least one readout integrated circuit 31,32 are used, e.g. Chips #1 and #2 are used together, the pitch along diagonals is decreased to 1.4-L. Combination of the first and the third at least one readout integrated circuit 31,33, e.g. Chip #3 together with Chip #1, allows a reduction of pitch to L in horizontal direction, while combination of the first and the fourth at least one readout integrated circuit 31, 34, e.g. Chip #4 together with Chip #1, may provide a reduction of pitch to L in vertical direction. Finally, if all the readout integrated circuits are installed and used, the pitch is L along horizontal and vertical directions, and 1.4-L along diagonals, which can be considered as a high end solution.

Referring to FIG. 4, a second possible scheme for routing the pixel signals of a detector array by an electric circuit according to embodiments of the present invention is shown. The first plurality of pixels 33 may again comprise all pixels of the radiation detector array having both an odd row index and an odd column index. Thus in embodiments of the present invention, the first plurality of pixels may be arranged such that the first plurality of pixels does not contain an adjacent pair of pixels. However, unlike the previous exemplary arrangement, this does not apply to the second, third and fourth plurality of pixels. Here, the detector area may be divided in contiguous zones, each zone corresponding to one of the second, third or fourth plurality of pixels 34, 35, 36. For example, the pixels in each zone that are not already connected to the first readout connector 11 by the electrical routing means 19, may be connected to the second, third or fourth readout connector 12,13,14 as corresponds with the particular zone.

In this example, a smart signal routing is provided, in the sense that the spatial resolution of the array can be improved locally by adding readout chips to the system, and several combinations are possible. For example, if only the first at least one readout integrated circuit 31 is used, e.g. Chip #1, the spatial resolution can be 2-L in horizontal and vertical directions, and 2.8-L along diagonals, wherein L refers to the pixel pitch of the detector array 21. This may be considered as a low cost solution.

However, if the first at least one readout integrated circuit 31 is combined with any of the second, third or fourth at least one readout integrated circuit 32, 33, 34, the pitch is improved to L along horizontal and vertical directions, and to 1.4-L along diagonals, but only in the specific region of the array corresponding to the second, third or fourth at least one readout integrated circuit being used. If all the readout integrated circuits are installed and used, the pitch is L along horizontal and vertical directions, and 1.4-L along diagonals, over the full array active area, which can be considered as a high end solution.

Figures 5, 6:
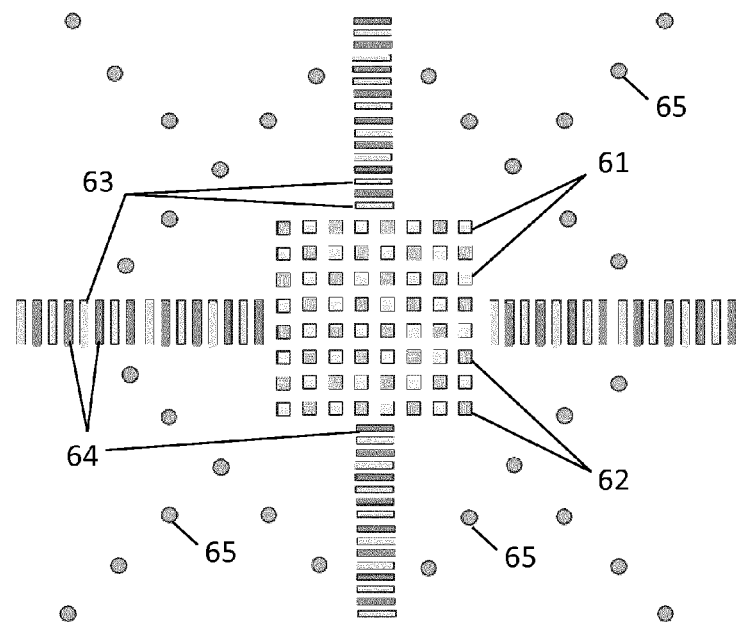
FIG. 5 shows an exemplary method according to embodiments of the present invention.
FIG. 6 shows a third exemplary routing arrangement for an electric circuit board according to embodiments of the present invention.

FIG. 6 illustrates another exemplary embodiment of the present invention, in which the at least two groups of pixels of the radiation detector array comprise five exemplary disjunct groups of pixels. A first group 61 and a second group 62 are spatially intermixed in both a first direction and a second direction over a central region of the detector. A third group 63 comprises a linear horizontal array and a linear vertical array for extending the detector range over a wider area. The pixels of a fourth group 64 are interspersed with the pixels of this third group 63 such as to enhance the spatial resolution of the third group 63 by selecting the third group 63 and the fourth group 64 in combination. The pixels of a fifth group 65 may be arranged off the principal axes defined by the orthogonal linear arrays of the third group 63.

In a second aspect, the present invention relates to a method for configuring a radiation image sensor, e.g. a radiation image sensor according to embodiments of the first aspect of the present invention. The method comprises providing a radiation detector array having at least two groups of pixels and at least two readout connectors corresponding to the at least two groups of pixel. The method further comprises routing electrical signals from each of the at least two groups of pixels to a corresponding readout connector of the at least two readout connectors. The method also comprises connecting at least one pluggable readout module to a corresponding at least one readout connector of the at least two readout connectors such that a group or subset of groups of the at least two groups of pixels is selected.

A method for configuring a radiation image sensor in accordance with embodiments of the present invention may, for example, be a method for configuring a radiation image sensor in accordance with a spatial resolution requirement. The spatial resolution requirement may for example be a desired minimum spatial resolution over the entire active area of the radiation image sensor. However, the spatial resolution requirement may also be a desired minimum spatial resolution defined as function of location on the radiation image sensor. A method for configuring a radiation image sensor in accordance with embodiments of the present invention may, for example, be a method for configuring a radiation image sensor in accordance with a detector area requirement, e.g. a field of view requirement.

FIG. 5 shows an exemplary method 100 according to embodiments of the present invention. The method 100 comprises providing 102 a radiation detector array 21 having at least two groups of pixels 33,34 and at least two readout connectors 11,12 corresponding to the at least two groups of pixels 33,34. Providing 102 the radiation detector array 21 may comprise providing the detector array 21 such that the pixels of at least some different groups of the at least two groups of pixels are spatially intermixed. Providing 102 the radiation detector array 21 may comprise providing the detector array 21 such that the at least two groups of pixels comprise a first group of pixels 33 consisting of a number of pixels less than or equal to about half of the number of pixels of the radiation detector array 21 and the first group of pixels 33 is distributed over the radiation detector array such as to obtain a substantially uniform distribution of pixels of the first group of pixels 33 over the radiation detector array 21.

The method 100 also comprises routing 104 electrical signals from each of the at least two groups of pixels 33, 34 to a corresponding readout connector of said at least two readout connectors 11,12.

For example, the method may comprise routing electrical signals generated by a first plurality of pixels 33 of the radiation detector array 21 to a first readout connector 11, in which the number of pixels in the first plurality of pixels 33 is less than or equal to about half of the number of pixels of the radiation detector array 21 and the first plurality of pixels 33 is distributed over the radiation detector array such as to obtain a substantially uniform distribution of pixels of the first plurality of pixels 33 over the active area of the radiation detector array 21. This routing 104 may also comprise routing electrical signals generated by a second plurality of pixels 34 of the radiation detector array 21 to a second readout connector 12.

The method also comprises connecting 106 at least one pluggable readout module 31, 32 to a corresponding at least one readout connector of the at least two readout connectors 11, 12 such that a group or subset of groups of the at least two groups of pixels is selected. This connecting 106 may, for example, comprise connecting at least one readout integrated circuit to the first readout connector and/or to the second readout connector, in which this connecting may take a spatial resolution or detector area requirement into account. For example, when a desired minimum spatial resolution over the entire area of the detector is smaller than or about equal to the spatial resolution provided by the uniform distribution of pixels of the first plurality of pixels 33 over the active area of the radiation detector array 21, a readout integrated circuit may be connected to the first readout connector, while no readout integrated circuit may be connected to the second readout connector. However, when the desired spatial resolution is higher than this spatial resolution provided by the uniform distribution of pixels of the first plurality of pixels 33 over the active area of the radiation detector array 21, a readout integrated circuit may be connected to both the first and the second readout connector.

By removing one or more readout chips, the spatial resolution may be reduced over at least a portion of the detector array. Therefore, spatial resolution or field of view can be easily reconfigured in accordance with embodiments of the present invention, without compromising the functionality and usability of the radiation image sensor.

The invention claimed is:

1. A radiation sensor, comprising:
    a radiation detector array having a plurality of pixels;
    at least two readout connectors having a plurality of contacts, each readout connector being configured for receiving a readout module;
    a routing circuit having conductors configured for routing electrical signals from each of the plurality of pixels to a corresponding contact of a readout connector,
    wherein the plurality of pixels is grouped in two or more groups of pixels, at least two pixels of a first group of pixels being separated by at least one pixel from another group of pixels, the routing circuit being configured for leading signals from pixels of the first group to a first readout connector and signals from pixels from the other group of pixels to a second readout connector.

2. The radiation sensor according to claim 1, wherein the pixels of the two or more groups are uniformly distributed and intermixed in said radiation detector array.

3. The radiation sensor according to claim 1, further comprising the readout module.

4. The radiation sensor according to claim 1, wherein pixels of at least two different groups of the at least two groups of pixels are spatially intermixed.

5. The radiation sensor according to claim 4, wherein pixels of at least two different groups of the at least two groups of pixels are spatially intermixed in at least a first and a second direction.

6. The radiation sensor according to claim 1, wherein the radiation detector array has a track of pixels being spatially intermixed by alternating along said track pixels of two different groups of the at least two groups, the track being defined as a number of adjacent pixels along a line.

7. The radiation sensor according to claim 1, wherein the at least two groups of pixels include a first group of pixels distributed over the radiation detector array in a substantially uniform distribution.

8. The radiation sensor according to claim 7, wherein the at least two groups of pixels further include a second group of pixels, wherein the second group of pixels is distributed over the radiation detector array in a substantially uniform distribution.

9. The radiation sensor according to claim 1, wherein the at least two groups of pixels further includes a third group of pixels, wherein the third group of pixels is distributed in one or more regions over the radiation detector array in a concentrated distribution.

10. The radiation sensor according to claim 1, wherein the routing circuit includes a printed circuit board.

11. The radiation sensor according to claim 1, wherein each readout connector of the at least two readout connectors is adapted for enabling the mechanical disconnection of a corresponding readout module.

12. The radiation sensor according to claim 1, wherein each readout connector of the at least two readout connectors further includes at least one socket for receiving a readout module.

13. The radiation sensor according to claim 1, wherein the radiation detector array is at least one of a linear array of pixels, a two-dimensional array of pixels or a three-dimensional array of pixels.

14. A method for configuring a radiation image sensor, the method comprising:
- providing a radiation detector array comprising a plurality of pixels;
- providing at least two readout connectors having a plurality of contacts, each readout connector being configured for receiving a readout module;
- providing a routing circuit having conductors configured for routing electrical signals from each of the plurality of pixels to a corresponding contact of a readout connector;
- grouping the plurality of pixels in two or more groups of pixels, at least two pixels of a first group of pixels being separated by at least one pixel from another group of pixels; and
- configuring the routing circuit for leading pixels of the first group of pixels to a first readout connector, and pixels from the other group of pixels to a second readout connector.

15. The method according to claim 14, wherein the grouping further comprises distributing and intermixing the pixels of the two uniformly.

16. The method according to claim 14, wherein providing the radiation detector array further comprises providing the detector array having pixels of at least two different groups of the at least two groups of pixels spatially intermixed.

17. The method according to claim 14, wherein providing the radiation detector array further comprises providing the detector array having the at least two groups of pixels include a first group of pixels distributed over the radiation detector array in a substantially uniform distribution.

18. The method according to claim 17, wherein providing the radiation detector array further comprises providing the detector array having a second group of pixels distributed over the radiation detector array in a substantially uniform distribution.

19. The method according to claim 14, wherein providing the radiation detector array further comprises providing the detector array having a third group of pixels distributed in one or more regions over the radiation detector array in a concentrated distribution.

20. The method according to claim 14, wherein providing the routing circuit further comprises providing the routing circuit having a printed circuit board.

* * * * *